United States Patent
Onishi

(10) Patent No.: US 9,712,122 B2
(45) Date of Patent: Jul. 18, 2017

(54) DISTORTION COMPENSATION APPARATUS AND WIRELESS COMMUNICATION EQUIPMENT

(71) Applicant: SUMITOMO ELECTRIC INDUSTRIES, LTD., Osaka-shi, Osaka (JP)

(72) Inventor: Masahiko Onishi, Osaka (JP)

(73) Assignee: SUMITOMO ELECTRIC INDUSTRIES, LTD., Osaka-shi, Osaka (JP)

( * ) Notice: Subject to any disclaimer, the term of this patent is extended or adjusted under 35 U.S.C. 154(b) by 0 days.

(21) Appl. No.: 14/425,894

(22) PCT Filed: Aug. 22, 2013

(86) PCT No.: PCT/JP2013/072451
§ 371 (c)(1),
(2) Date: Mar. 4, 2015

(87) PCT Pub. No.: WO2014/050383
PCT Pub. Date: Apr. 3, 2014

(65) Prior Publication Data
US 2015/0295545 A1    Oct. 15, 2015

(30) Foreign Application Priority Data

Sep. 25, 2012 (JP) ................................ 2012-211115
Apr. 30, 2013 (JP) ................................ 2013-095699

(51) Int. Cl.
H04B 1/04    (2006.01)
H03F 1/26    (2006.01)
(Continued)

(52) U.S. Cl.
CPC ............. H03F 1/3247 (2013.01); H03F 1/32 (2013.01); H03F 3/24 (2013.01); H04B 1/0475 (2013.01);
(Continued)

(58) Field of Classification Search
CPC ................. H03F 1/3241; H03F 1/3247; H03F 2200/451; H03F 2201/3227;
(Continued)

(56) References Cited

U.S. PATENT DOCUMENTS 7,071,777 B2 * 7/2006 McBeath .............. H03F 1/3241
330/136
7,429,892 B2    9/2008 Batruni
(Continued)

FOREIGN PATENT DOCUMENTS

JP    2004-128867 A    4/2004
JP    2004128867 A *    4/2004
(Continued)

OTHER PUBLICATIONS

Youngchel Park, et al., "Adaptive Predistortion Linearization of RF Power Amplifiers Using Looup Tabels Generated form Subsampled Data," IEEE 2002, pp. 233-236.

*Primary Examiner* — Quochien B Vuong
(74) *Attorney, Agent, or Firm* — Drinker Biddle & Reath LLP

(57) ABSTRACT

A distortion compensation apparatus that compensates for distortion of an amplifier is provided. The distortion compensation apparatus includes: a distortion compensation processing section that performs a predistortion process for a signal provided to the amplifier, based on an amplifier model of the amplifier, and outputs a compensated signal; an estimation section that estimates the amplifier model; and a filter. The estimation section estimates the amplifier model, based on the compensated signal and a monitor signal obtained by monitoring an output of the amplifier. The monitor band of the monitor signal provided to the estimation section is narrower than a frequency band of the compensated signal. The filter is provided so as to eliminate an influence of a signal component outside the monitor band among signal components of the compensated signal, on the estimation of the amplifier model by the estimation section.

8 Claims, 8 Drawing Sheets

(51) Int. Cl.
  *H03F 1/32* (2006.01)
  *H03F 3/24* (2006.01)
(52) U.S. Cl.
  CPC ............. *H03F 2201/3215* (2013.01); *H04B 2001/0425* (2013.01)
(58) Field of Classification Search
  CPC . H03F 2001/3233; H04B 1/04; H04B 1/0475; H04B 1/71072; H04B 2001/0408; H04L 27/367; H04L 27/368
  USPC ....... 455/63.1, 67.13, 114.2, 114.3; 375/296, 375/297; 330/75, 149
  See application file for complete search history.

(56) References Cited

U.S. PATENT DOCUMENTS

| | | | |
|---|---|---|---|
| 7,688,139 B2 | 3/2010 | Batruni | |
| 7,746,955 B2 * | 6/2010 | Rexberg | H03F 1/3258 375/254 |
| 8,536,943 B2 * | 9/2013 | Irvine | H03F 1/3247 330/126 |
| 8,773,201 B2 * | 7/2014 | Yamamoto | H04B 1/0475 330/127 |
| 8,836,426 B2 * | 9/2014 | Lozhkin | H03F 1/3247 330/149 |
| 8,903,015 B2 * | 12/2014 | Haddad | H03F 1/3247 375/297 |
| 9,184,710 B2 * | 11/2015 | Braithwaite | H03F 1/3247 |
| 2003/0223509 A1 | 12/2003 | Ma | |
| 2005/0212596 A1 | 9/2005 | Batruni | |
| 2010/0194474 A1 | 8/2010 | Ishikawa et al. | |
| 2011/0163806 A1 | 7/2011 | Hongo | |
| 2012/0194271 A1 | 8/2012 | Yamamoto et al. | |
| 2012/0200355 A1 | 8/2012 | Braithwaite | |
| 2013/0285743 A1 | 10/2013 | Onishi | |

FOREIGN PATENT DOCUMENTS

| | | |
|---|---|---|
| JP | 2006-093947 A | 4/2006 |
| JP | 2007-531414 A | 11/2007 |
| JP | 2010-068142 A | 3/2010 |
| JP | 2010-183310 A | 8/2010 |
| JP | 4909261 B2 | 4/2012 |
| WO | WO 2007/134637 A1 | 11/2007 |
| WO | WO 2012/086379 A1 | 6/2012 |

* cited by examiner

DISTORTION COMPENSATION APPARATUS AND WIRELESS COMMUNICATION EQUIPMENT

TECHNICAL FIELD

The present invention relates to a distortion compensation apparatus and wireless communication equipment.

BACKGROUND ART

When power is amplified by using an amplifier such as a high power amplifier (hereinafter referred to as "HPA") or the like, desired input-output characteristics may not be obtained due to nonlinear distortion characteristics of the amplifier.

In particular, when the frequency of a radio signal to be amplified is high, in order to linearize the amplifier by compensating for the nonlinear distortion characteristics, the amplifier needs to be subjected to predistortion for canceling the nonlinear distortion characteristics of the amplifier by using digital signal processing. Such predistortion requires a monitor signal obtained by monitoring an output of the amplifier.

CITATION LIST

Patent Literature

PATENT LITERATURE 1: Japanese Laid-Open Patent Publication (translation of PCT application) No. 2007-531414

SUMMARY OF INVENTION

Technical Problem

When distortion is compensated, generally, the distortion compensation is performed over a frequency band about five times the frequency band of an original signal to be transmitted.

Therefore, for example, if the frequency band of the original signal to be transmitted is 20 MHz, a monitor speed of 100 MHz or more is required, which causes an increase in device cost.

Further, if the frequency band of the signal to be transmitted is extended to 100 MHz, a monitor speed of 500 MHz or more is required, which makes it difficult to realize the device at a practical cost.

Patent literature 1 describes that the monitor band is made narrower than the frequency band required for distortion compensation.

By narrowing the monitor band, the monitor speed can be reduced, and cost reduction can be achieved.

However, the inventors of the present invention have found that, if the monitor band is simply narrowed, a distortion signal outside the monitor band cannot be monitored, which may make the distortion compensation apparatus unstable.

An object of the present invention is to realize stable operation of a distortion compensation apparatus even when the monitor band is narrowed.

Solution to Problem

The present invention is a distortion compensation apparatus that compensates for distortion of an amplifier, and includes: a distortion compensation processing section that performs a predistortion process for a signal provided to the amplifier, based on an amplifier model of the amplifier, and outputs a compensated signal; an estimation section that estimates the amplifier model; and a filter. The estimation section estimates the amplifier model, based on the compensated signal and a monitor signal obtained by monitoring an output of the amplifier. A monitor band of the monitor signal provided to the estimation section is narrower than a frequency band of the compensated signal. The filter is provided so as to eliminate an influence of a signal component outside the monitor band among signal components of the compensated signal, on the estimation of the amplifier model by the estimation section.

The present invention can be realized not only as such a characteristic compensation apparatus but also as a system including the compensation apparatus. In addition, the present invention can be realized as a method including steps of characteristic processes performed in the compensation apparatus, or as a program for causing a computer to execute such steps. Further, the present invention can be realized as a semiconductor integrated circuit that realizes part or entirety of the compensation apparatus. The above program can be stored in a storage medium such as a CD-ROM.

Advantageous Effects of Invention

According to the present invention, even when the monitor band is narrowed, the distortion compensation apparatus can be stably operated.

DESCRIPTION OF EMBODIMENTS

[Summary of Embodiments]

Figure 1:
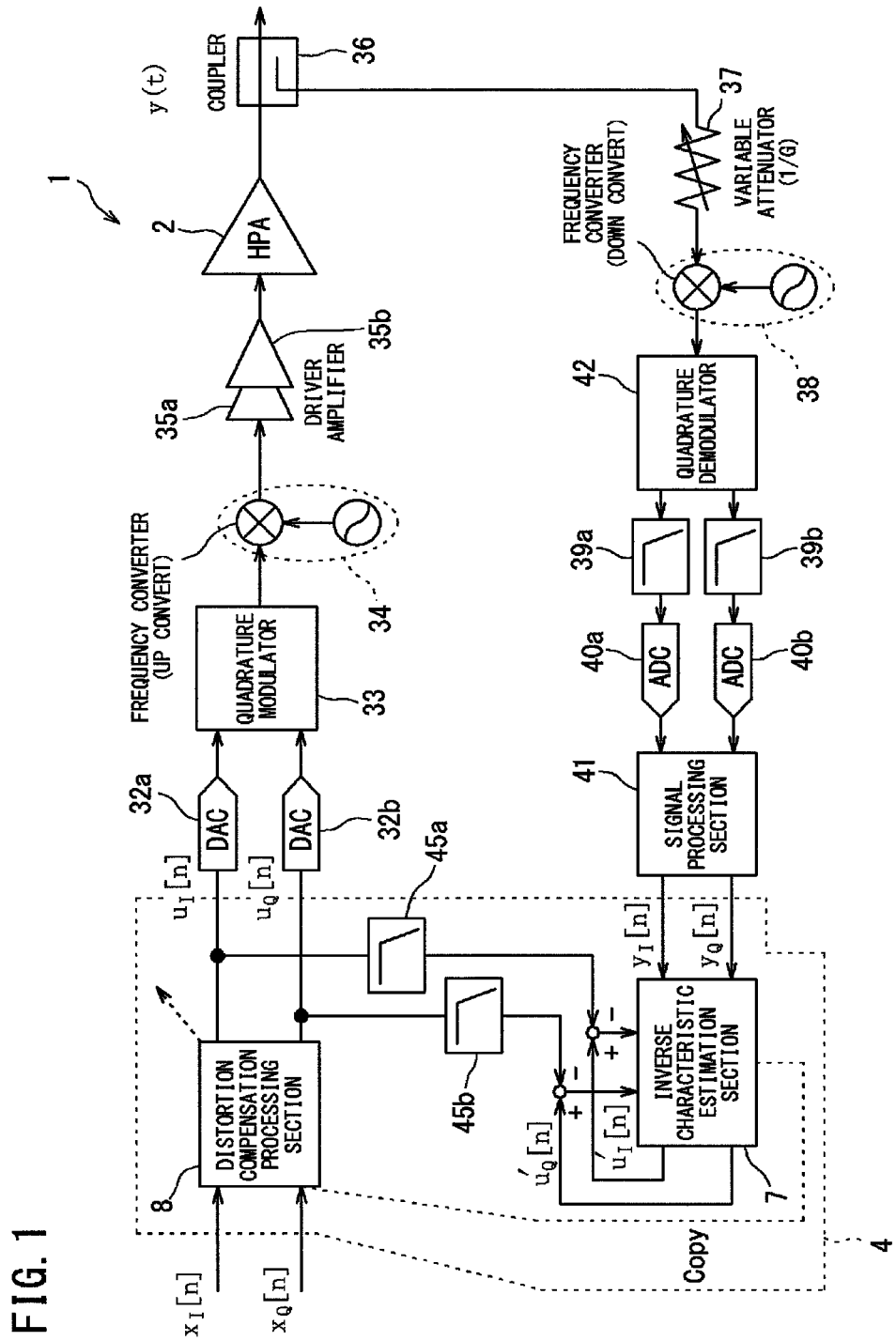
FIG. 1 is a circuit diagram of an amplifier circuit including a distortion compensation apparatus according to the first embodiment.

The summary of the embodiments of the present invention includes at least the following.

(1) An aspect of the present invention is a distortion compensation apparatus that compensates for distortion of an amplifier. The distortion compensation apparatus includes: a distortion compensation processing section that performs a predistortion process for a signal provided to the amplifier, based on an amplifier model of the amplifier, and outputs a compensated signal; an estimation section that estimates the amplifier model; and a filter. The estimation section estimates the amplifier model, based on the compensated signal and a monitor signal obtained by monitoring an output of the amplifier. A monitor band of the monitor signal provided to the estimation section is narrower than a frequency band of the compensated signal. The filter is provided so as to eliminate an influence of a signal component outside the monitor band among signal components of the compensated signal, on the estimation of the amplifier model by the estimation section.

According to the present invention, the filter eliminates an influence of the signal component outside the monitor band among the signal components of the compensated signal, on the estimation of the amplifier model. Therefore, even when the monitor band is narrowed, the distortion compensation apparatus can be stably operated.

(2) The filter is preferably provided so as to restrict the frequency band of the compensated signal provided to the estimation section side, to the frequency band of the monitor signal. In this case, the frequency band of the compensated signal provided to the estimation section side can be restricted to the frequency band of the monitor signal.

(3) The estimation section is preferably provided so as to generate a replica signal of the compensated signal, based on the monitor signal obtained by monitoring the output of the amplifier, and estimate the amplifier model, based on an error signal indicating an error of the replica signal with respect to the compensated signal. In this case, the frequency band of the error signal can be restricted to the frequency band of the monitor signal.

(4) The distortion compensation apparatus preferably further includes: a sequence characteristic estimation section that estimates, based on an input signal to the distortion compensation processing section and the monitor signal, a sequence model of an amplification sequence including the amplifier and the distortion compensation processing section, and performs, based on the estimated sequence model, a distortion adding process for the input signal to output a distortion-added signal; and an ACLR calculation section that calculates an ACLR based on the distortion-added signal output from the sequence characteristic estimation section. In this case, the ACLR of the output signal of the amplifier is calculated based on the distortion-added signal in which adjacent frequency components in a wider frequency band as compared to the monitor signal is reflected. Therefore, it is possible to calculate the ACLR with higher accuracy as compared to the configuration in which the ACLR of the output signal of the amplifier is calculated based on the monitor signal.

(5) The sequence characteristic estimation section preferably generates, based on the input signal, a replica signal of an output signal from the amplification sequence, and estimates the sequence model based on an error signal indicating an error of the replica signal with respect to the monitor signal. In this case, the sequence model can be calculated based on the input signal.

(6) The distortion compensation apparatus preferably further includes: an amplifier characteristic estimation section that estimates the amplifier model based on the compensated signal and the monitor signal, and performs a distortion adding process for the input signal based on the amplifier model to output a distortion-added signal; and an ACLR calculation section that calculates an ACLR based on the distortion-added signal output from the amplifier characteristic estimation section. In this case, the ACLR of the output signal of the amplifier is calculated based on the distortion-added signal in which adjacent frequency components in a wider frequency band as compared to the monitor signal is reflected. Therefore, it is possible to calculate the ACLR with higher accuracy as compared to the configuration in which the ACLR of the output signal of the amplifier is calculated based on the monitor signal.

(7) The amplifier characteristic estimation section preferably generates, based on the compensated signal, a replica signal of an output signal from the amplifier, and estimates the amplifier model based on an error signal indicating an error of the replica signal with respect to the monitor signal. In this case, the amplifier model can be calculated based on the compensated signal.

(8) The amplifier preferably has a power efficiency of 30% or more. In the high-efficiency amplifier having the power efficiency of 30% or more, distortion is likely to increase, and the frequency band of the compensated signal is likely to be wide. Therefore, application of the present invention is particularly useful, which allows the distortion compensation apparatus to stably operate even when the frequency band of the compensated signal is restricted to the frequency band of the monitor signal.

(9) A frequency band of the signal before subjected to the predistortion process by the distortion compensation processing section is preferably 20 MHz or higher. When the frequency band of the signal is 20 MHz or higher, since the necessity of the predistortion process is high, application of the present invention is particularly useful.

(10) Another aspect of the present invention is wireless communication equipment provided with the distortion compensation apparatus according to any one of the above (1) to (9).

[Details of Embodiments]

Hereinafter, preferred embodiments of the present invention will be described with reference to the drawings.

[1. First Embodiment]

FIG. 1 shows an amplifier circuit 1 including a distortion compensation apparatus 4 according to the first embodiment. The amplifier circuit 1 is included in wireless communication equipment such as wireless base station equipment, and is used for amplification of a transmission signal to be transmitted as a radio signal. The amplifier circuit 1 may be used for amplification of a reception signal.

In FIG. 1, *[n] represents a digital complex baseband IQ signal which is, when a sampling interval is T (sec), sampled at time n×T. In addition, *(t) indicates an analog signal at time t.

The amplifier circuit 1 includes, as major components, a high-power amplifier (HPA) 2, and the distortion compensation apparatus 4. The amplifier 2 amplifies an input signal. The amplifier 2 is a high-efficiency amplifier having, for example, a power efficiency of 30% or more, and more preferably, a power efficiency of 40% or more. The higher the efficiency of the amplifier 2 is, the more the amplifier 2 causes distortion. Therefore, the frequency band of a compensation signal output from the distortion compensation apparatus 4 needs to be broad.

The distortion compensation apparatus 4 performs distortion compensation by digital signal processing. The distortion compensation apparatus 4 includes an estimation section 7 that estimates a model of the amplifier 2 (amplifier model), and a distortion compensation processing section 8 that performs a predistortion process for a signal $x[n]$ $(=x_I[n]+i\times x_Q[n])$. The signal $x[n]$ is an input signal to the amplifier circuit 1, and is generated as a digital signal.

The estimation section 7 of the present embodiment is configured as an inverse characteristic estimation section 7 that estimates an inverse model representing an inverse characteristic of the amplifier 2, as a model of the amplifier 2 (amplifier model). The model of the amplifier 2 is not necessarily the inverse model, but may be a forward model.

A model estimation method of the estimation section 7 of the present embodiment will be described later.

The distortion compensation processing section 8 obtains the inverse model of the amplifier 2, which has been estimated by the estimation section 7, performs a distortion compensation process for the signal x[n], based on the inverse model, and outputs the distortion-compensated signal u[n] ($=u_I[n]+i \times u_Q[n]$).

Since the compensated signal u[n], which has been compensated with the characteristic inverse to the distortion characteristic of the amplifier 2, is provided to the amplifier 2 having the distortion characteristic, a distortion-suppressed amplifier output y[n] can be obtained.

The amplifier circuit 1 also includes components other than the distortion compensation apparatus 4 and the amplifier 2.

In FIG. 1, DACs (DA converters) 32a, 32b for converting a digital signal into an analog signal are provided on the output side of the distortion compensation apparatus 4. The compensated signals (analog I and Q baseband signals), which have been converted into analog signals by the DACs 32a, 32b, are quadrature-modulated by a quadrature modulator 33. The quadrature-modulated signal is up-converted by a frequency converter 34. The up-converted signal is provided to one or a plurality of driver amplifiers 35a, 35b, and amplified. The output from the driver amplifiers 35a, 35b is provided to the amplifier 2.

In FIG. 1, an output signal y(t) of the amplifier 2 is detected by a coupler 36, and is provided to a frequency conversion section 38 via a variable attenuator (1/G) 37. The frequency conversion section 38 down-converts the signal (analog signal). The frequency-converted signal is provided to a quadrature demodulator 42.

The quadrature demodulator 42 outputs quadrature-demodulated analog I and Q baseband signals. The analog I signal and the analog Q signal are provided to ADCs (AD converters) 40a, 40b via low-pass filters (or bandpass filters) 39a, 39b, respectively.

The ADCs 40a, 40b convert the analog I signal and the analog Q signal into digital signals, respectively, and provide the digital signals to a signal processing section 41. The signal processing section 41 performs necessary signal processing for the digital I signal and the digital Q signal.

The signal processing section 41 provides the digital I signal and the digital Q signal to the distortion compensation apparatus 4 as monitor signals. The signal processing section 41 has a sampling frequency conversion function.

While analog quadrature demodulation is performed in FIG. 1, the signals before subjected to quadrature demodulation may be converted into digital signals by AD converters, and the digital signals may be subjected to digital quadrature demodulation by the signal processing section 41.

x[n] is an input signal before subjected to distortion compensation by the distortion compensation apparatus 4.

In FIG. 1, $x_I[n]$ is a real part (I-channel) of x[n], and $x_Q[n]$ is an imaginary part (Q-channel) of x[n]. That is, $x[n]=x_I[n]+i \times x_Q[n]$ is satisfied.

u[n] is an input signal (compensated signal) subjected to distortion compensation by the distortion compensation apparatus 4.

In FIG. 1, $u_I[n]$ is a real part (I-channel) of u[n], and $u_Q[n]$ is an imaginary part (Q-channel) of u[n]. That is, $u[n]=u_I[n]+i \times u_Q[n]$ is satisfied.

u'[n] is a replica signal for inverse characteristic estimation. In FIG. 1, $u_I'[n]$ is a real part (I-channel) of u'[n], and $u_Q'[n]$ is an imaginary part (Q-channel) of u'[n]. That is, $u'[n]=u_I'[n]+i \times u_Q'[n]$ is satisfied.

y[n] is a monitor signal obtained by monitoring the output signal y(t) of the amplifier 2, and $y_I[n]$ is a real part (I-channel) of y[n] and $y_Q[n]$ is an imaginary part (Q-channel) of y[n]. That is, $y[n]=y_I[n]+i \times y_Q[n]$ is satisfied.

The estimation section 7 obtains the compensated signals (digital signals) $u_I[n]$ and $u_Q[n]$ output from the distortion compensation processing section 8 and the monitor signals (digital signals) $y_I[n]$ and $y_Q[n]$ obtained by monitoring the output signal of the amplifier 2, and estimates a model (inverse model) of the amplifier 2, based on these signals $u_I[n]$, $u_Q[n]$, $y_I[n]$, and $y_Q[n]$.

In the estimation section 7, the monitor signals $y_I[n]$ and $y_Q[n]$ are subjected to distortion compensation based on the inverse model that the estimation section 7 currently possesses, thereby to calculate the replica signals $u_I'[n]$ and $u_Q'[n]$ of the compensated signals $u_I[n]$ and $u_Q[n]$.

Then, the estimation section 7 obtains error signals ($u_I'[n]-u_I[n]$), ($u_Q'[n]-u_Q[n]$) indicating errors between the compensated signals $u_I[n]$, $u_Q[n]$ and their replica signals $u_I'[n]$, $u_Q'[n]$, respectively.

The estimation section 7 performs a process to optimize the amplifier model (inverse model) so as to minimize the error signals. That is, based on the error signals, the inverse model possessed by the estimation section 7 is updated to provide a new inverse model. The updating of the inverse model is performed by obtaining a parameter representing the inverse model so as to minimize the error signals.

The inverse model (the parameter representing the inverse model) obtained by the estimation section 7 is copied to the distortion compensation processing section 8, and used for the distortion compensation process in the distortion compensation processing section 8.

In the present embodiment, the frequency band of the input signal (the signal before subjected to the predistortion process) x[n] to the amplifier circuit 1 is 20 MHz. Preferably, the frequency band of the input signal x[n] is, but not particularly limited to, 20 MHz or more.

Figure 2:
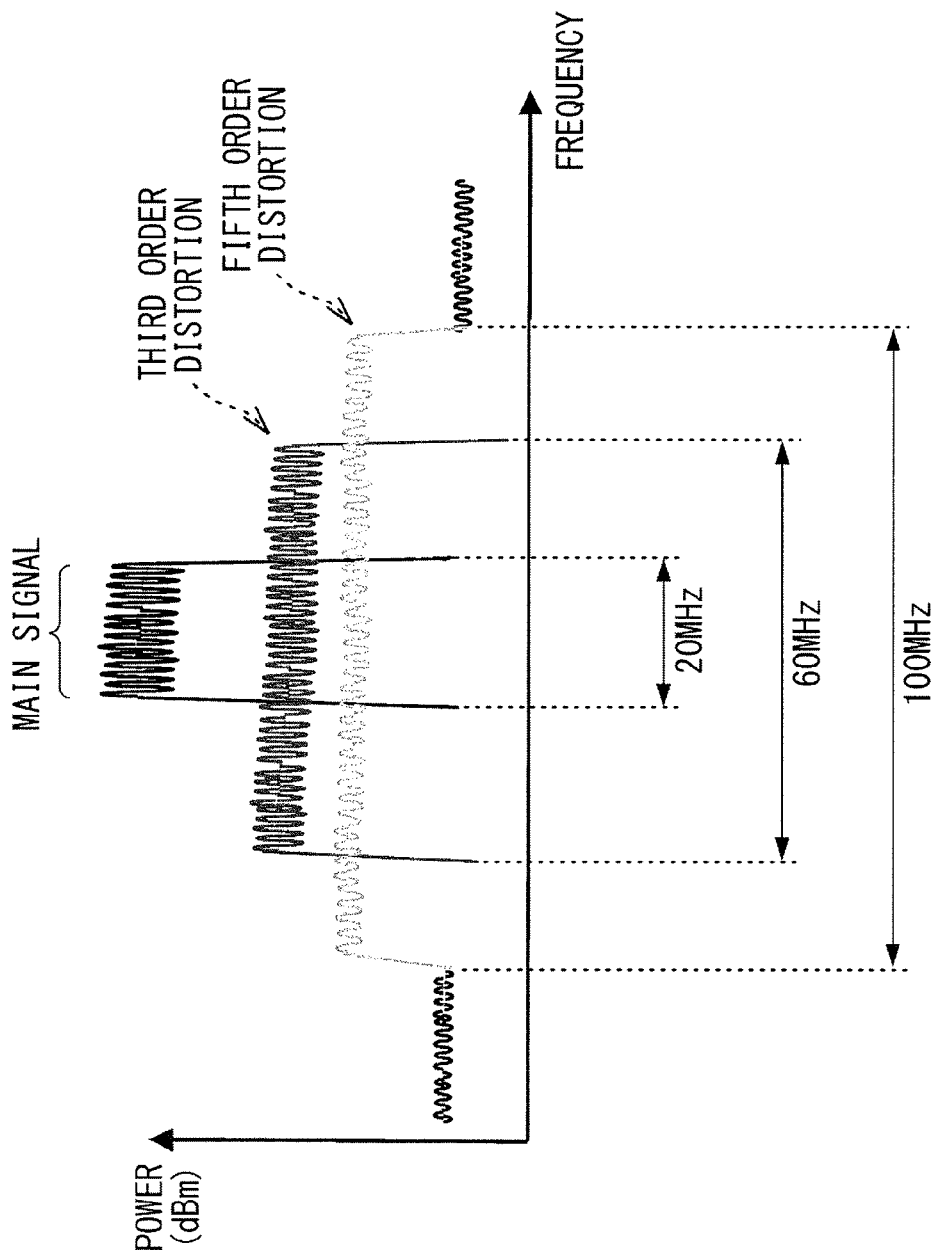
FIG. 2 shows a frequency spectrum of a compensated signal.

When the signal x[n] is amplified by the amplifier 2, as shown in FIG. 2, higher order distortions such as third order distortion and fifth order distortion are caused by the distortion characteristic of the amplifier 2. The third order distortion has a frequency band of 60 MHz which is three times the frequency band, 20 MHz, of the original signal (main signal) x[n]. The fifth order distortion has a frequency band of 100 MHz which is five times the frequency band, 20 MHz, of the original signal (main signal) x[n].

For example, when it is attempted to compensate and cancel distortions up to the fifth order distortion by the distortion compensation apparatus 4, the compensated signals $u_I[n]$, $u_Q[n]$ output from the distortion compensation processing section 8 have inverse distortions corresponding to the third order distortion and the fifth order distortion. Therefore, the compensated signals $u_I[n]$, $u_Q[n]$ each have a frequency band of 100 MHz, like that shown in FIG. 2.

That is, the amplifier model used for distortion compensation by the distortion compensation apparatus 4 is obtained by modeling an amplifier in the frequency band of 100 MHz corresponding to the fifth order distortion.

The sampling frequency of the DACs 32a, 32b that convert the compensated signals $u_I[n]$, $u_Q[n]$ as digital signals into analog signals is 100 MHz or more.

Figure 3:
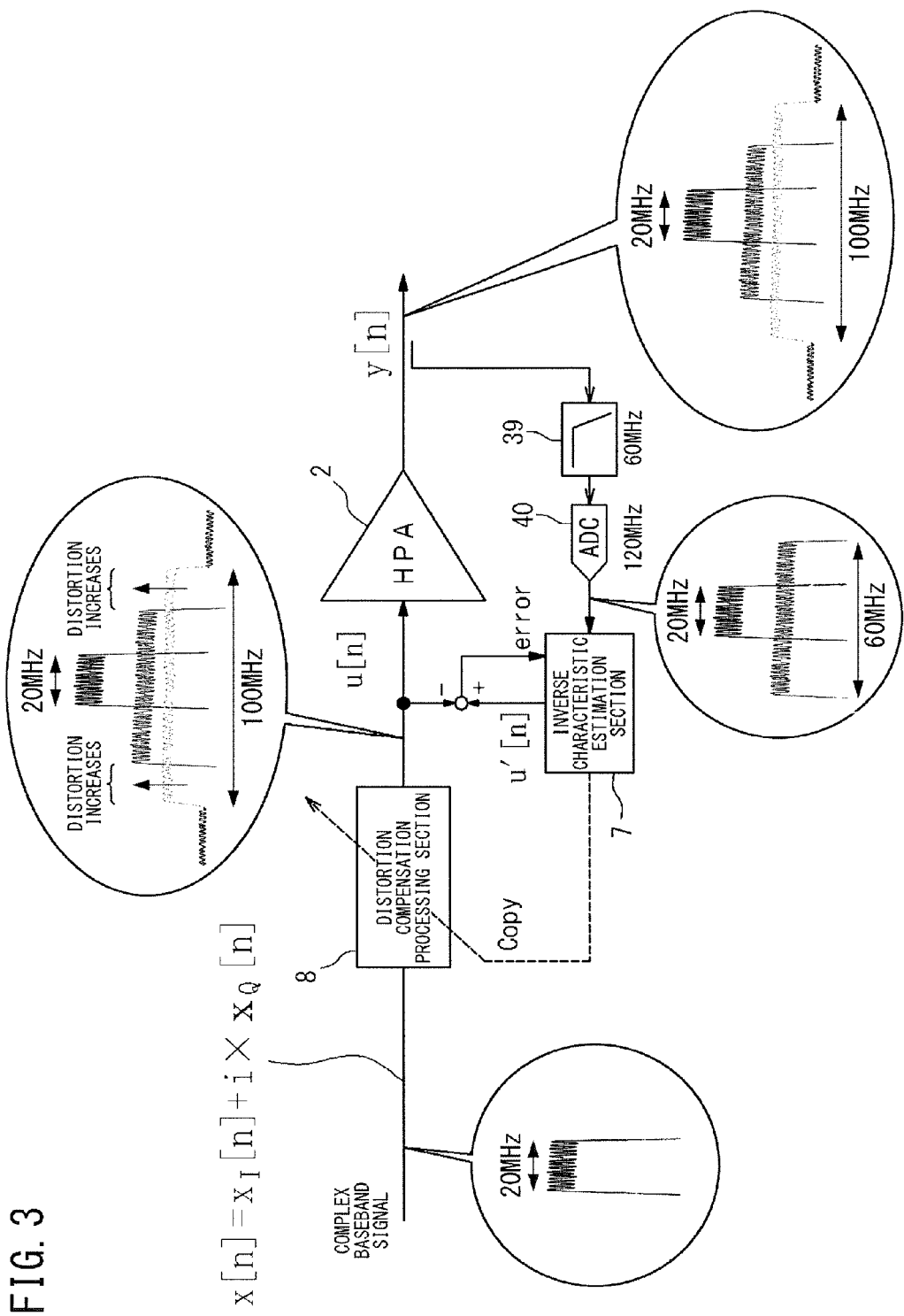
FIG. 3 is a diagram showing signal bands in portions of the amplifier circuit.

As shown in FIG. 3, in the state where the amplifier model of the distortion compensation apparatus 4 is not optimized, the higher order distortions such as the third order distortion and the fifth order distortion remain in the output signal y[n] of the amplifier 2.

Therefore, in order to optimize the amplifier model, the entire frequency band (up to the fifth order distortion) of the output signal y(t) of the amplifier 2 should be monitored. That is, the frequency band of the monitor signal (monitor band) should be 100 MHz corresponding to the frequency band of the fifth order distortion.

In other words, the monitor speed (monitor band) five times the signal band, 20 MHz, of the input signal x[n] is required.

When the monitor band is 100 MHz, the sampling frequency of the ADC 40 (40a, 40b) that converts the analog monitor signal into a digital signal should be 100 MHz or more, like the sampling frequency of the DAC 32a, 32b.

However, in the present embodiment, the sampling frequency of the ADC 40 (40a, 40b) is lower than the sampling frequency (100 MHz) of the DAC 32a, 32b. The sampling frequency of the ADC 40 (40a, 40b) of the present embodiment is 60 MHz, for example.

Therefore, the frequency band of the digital monitor signal (digital complex IQ baseband signal) output from the ADC 40 (40a, 40b) is 60 MHz as shown in FIG. 3.

However, the frequency band of the monitor signal is not limited to 60 MHz. Any frequency band may be adopted as long as it is narrower than the frequency band of the compensated signal $u_I[n]$, $u_Q[n]$. The lower limit of the frequency band of the monitor signal is not particularly limited. For example, the lower limit may be set within a range from 18% to 30% of the frequency band of the compensated signal $u_I[n]$, $u_Q[n]$ or to 40%, 50% or 60% thereof.

By the way, the narrower the frequency band of the monitor signal is, the lower the sampling frequency (monitor speed) of the ADC 40 (40a, 40b) can be. The lower the sampling frequency of the ADC 40 (40a, 40b) is, the lower the cost of the ADC 40 is. For example, when the sampling frequency (monitor speed) of the ADC 40 (40a, 40b) is lower than the sampling frequency of the DAC 32a, 32b, the cost of the amplifier circuit 1 can be reduced. In view of these points, the lower limit is preferably within the range from 18% to 30%.

On the other hand, when the frequency band of the monitor signal is reduced, distortion compensation performance of the amplifier circuit 1 tends to be degraded. In this regard, the inventors have confirmed that, if the frequency band of the monitor signal is substantially equal to the frequency band of the input signal x[n] (e.g., within a range from 18% to 25% of the frequency band of the compensated signal $u_I[n]$, $u_Q[n]$ when the frequency band of the input signal x[n] corresponds to 20% of the compensated signal $u_I[n]$, $u_Q[n]$), the distortion compensation performance of the amplifier circuit 1 is not rapidly degraded. Further, there is a trade-off relationship between the distortion compensation performance of the amplifier circuit 1 and the allowable range that depends on the use or the like of the amplifier circuit 1. That is, if the allowable range based on the use of the amplifier circuit 1 is wide, the distortion compensation performance may be low. In this case, the frequency band of the monitor signal can be reduced as long as the distortion compensation performance of the amplifier circuit 1 is within the allowable range.

In response to that the frequency band of the digital monitor signal output from the ADC 40 (40a, 40b) is 60 MHz, the filter 39 (39a, 39b) provided before the ADC 40 (40a, 40b) restricts the frequency band of the digital monitor signal to 60 MHz in advance.

Since the frequency band of the monitor signal is restricted, the frequency band (60 MHz) of the monitor signal $y[n]=y_I[n]+i \times y_Q[n]$ provided to the estimation section 7 becomes narrower than the frequency band (100 MHz) of the compensated signal $u_I[n]$, $u_Q[n]$ also provided to the estimation section 7.

As described above, in the estimation section 7, the replica signals $u_I'[n]$, $u_Q'[n]$ of the compensated signals $u_I[n]$, $u_Q[n]$ are calculated based on the monitor signals $y_I[n]$, $y_Q[n]$, respectively. In the present embodiment, since the frequency band of the monitor signal $y_I[n]$, $y_Q[n]$ is 60 MHz, the frequency band of the replica signal $u_I'[n]$, $u_Q'[n]$ of the compensated signal $u_I[n]$, $u_Q[n]$ is also 60 MHz.

As the result, the frequency band (60 MHz) of the replica signal $u_I'[n]$, $u_Q'[n]$ of the compensated signal $u_I[n]$, $u_Q[n]$ is narrower than the frequency band (100 MHz) of the compensated signal $u_I[n]$, $u_Q[n]$.

Therefore, in an error signal representing an error between the compensated signal and the replica signal of the compensated signal, a signal component, among signal components of the compensated signal, outside the frequency band of the replica signal (=the frequency band of the monitor signal=60 MHz) remains as it is.

The presence, in the error signal, of signal component outside the frequency band of the replica signal may cause the estimation section 7 to recognize that the inverse model possessed by the estimation section 7 does not much the inverse characteristic of the actual distortion characteristic of the amplifier 2 in a region outside the frequency band of the replica signal.

The estimation section 7 updates the inverse model based on such an error signal. Therefore, in the compensated signal which is output from the distortion compensation processing section 8 so as to cancel the signal component outside the frequency band of the replica signal in the error signal, a signal component thereof outside the frequency band of the replica signal (monitor signal) is increased, resulting in a more distorted compensated signal.

In other words, regarding the signal component outside the frequency band of the replica signal (monitor signal), the compensated signal is positively fed back, and thereby the compensated signal is unnecessarily distorted every time the inverse model is updated.

In this way, when the frequency band of the replica signal (monitor signal) is narrower than the frequency band of the compensated signal, the operation of the distortion compensation apparatus becomes unstable.

In contrast, in the present embodiment, as shown in FIG. 1, low-pass filters 45a, 45b or bandpass filters are provided which restrict the frequency band of the compensated signal that has been output from the distortion compensation processing section 8 and provided to the estimation section 7 side, to the frequency band (60 MHz) of the replica signal (monitor signal).

Since the filters 45a, 45b that restrict the frequency band of the compensated signal to the frequency band (60 MHz) of the replica signal (monitor signal) are provided, the frequency band of the compensated signal and the frequency band of the replica signal, for obtaining the error signal, match each other. As the result, the frequency band of the error signal also becomes 60 MHz, and the signal component outside the frequency band of the replica signal (monitor signal) is not included in the error signal.

When the frequency band of the error signal is 60 MHz, at the beginning of updating of the inverse model, the inverse model is optimized to a model which mainly cancels the third order distortion that can be observed in the frequency band of 60 MHz. After the third order distortion is sufficiently canceled, the fifth order distortion existing in the frequency band of 60 MHz becomes observable.

The inverse model estimated by the estimation section 7 is obtained by modeling the amplifier 2 so as to be able to cancel the distortions up to the fifth order distortion. Therefore, even if the fifth order distortion partially observed in the frequency band of 60 MHz is used, when estimation of the inverse model is performed, not only the fifth order distortion in the frequency band of 60 MHz but also the entirety of the fifth order distortion in the frequency band of 100 MHz can be suppressed.

Therefore, even if the monitor band (60 MHz) is narrower than the frequency band (100 MHz) to be originally monitored, the filters 45a, 45b eliminate influence of the signal component outside the monitor band among the compensated signal components, on the estimation of the model by the estimation section, and thereby the distortion in the frequency band corresponding to the frequency band to be monitored can be stably suppressed.

Consequently, even when the monitor band is narrowed, the operation of the distortion compensation apparatus 4 can be made stable.

[2. Second Embodiment]

Figure 4:
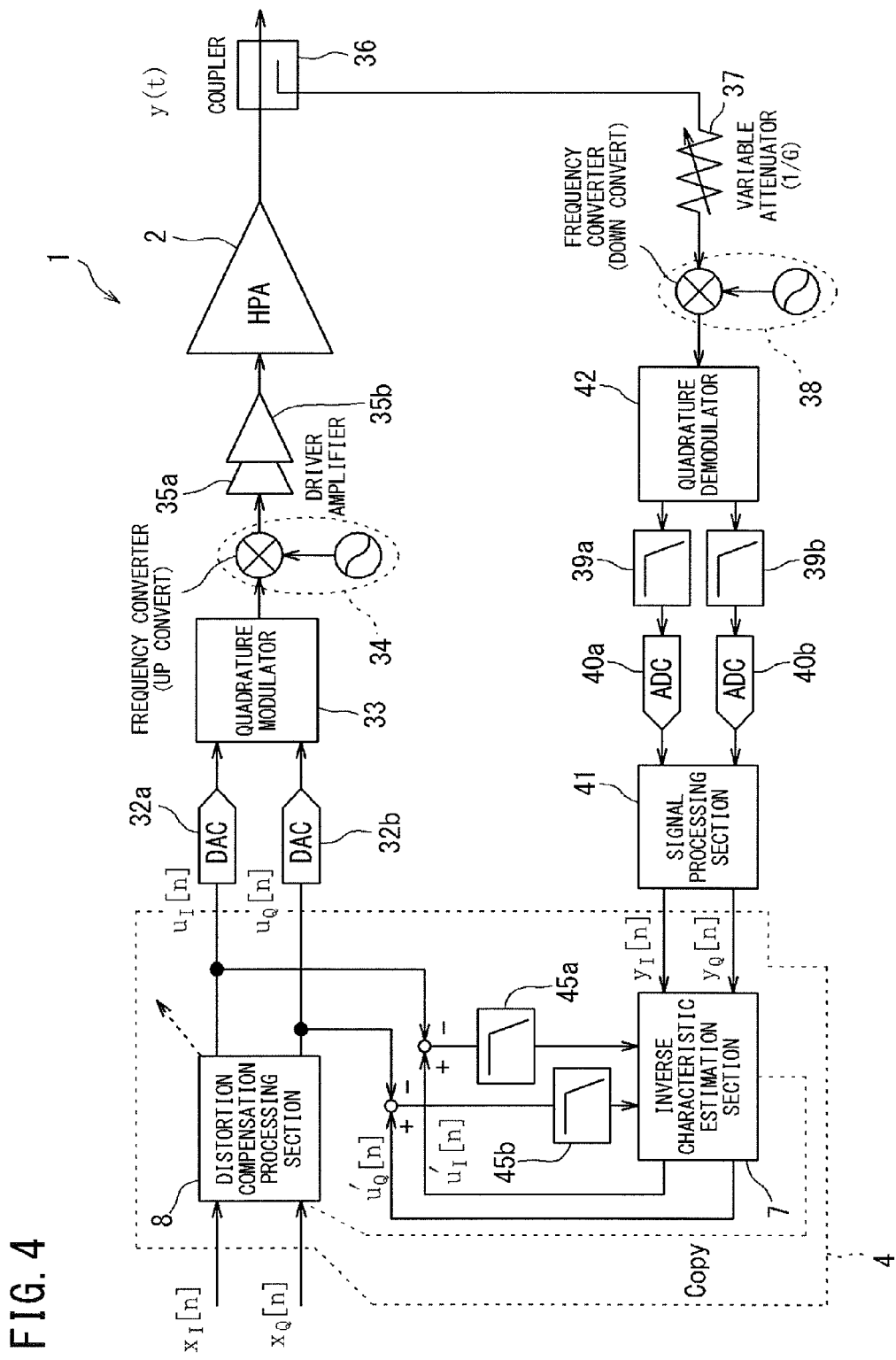
FIG. 4 is a circuit diagram of an amplifier circuit including a distortion compensation apparatus according to the second embodiment.

FIG. 4 shows an amplifier circuit 1 including a distortion compensation apparatus 4 according to the second embodiment.

In the distortion compensation apparatus 4 according to the second embodiment, the position where filters 45a, 45b are provided is different from that in the distortion compensation apparatus 4 according to the first embodiment.

In the second embodiment, the filters 45a, 45b are provided so as to restrict the frequency bands of error signals representing errors between the compensated signals $u_I[n]$, $u_Q[n]$ and their replica signals $u_I'[n]$, $u_Q'[n]$, respectively, to the frequency band (60 MHz) of the monitor signal.

In the second embodiment, the frequency band of the compensated signal $u_I[n]$, $u_Q[n]$, based on which calculation of the error signal is performed, is 100 MHz, and the frequency band of the replica signal $u_I'[n]$, $u_Q'[n]$, based on which calculation of the error signal is performed, is 60 MHz.

Therefore, in the error signal representing an error between the compensated signal and the replica signal of the compensated signal, a signal component, among the signal components of the compensated signal, outside the frequency band of the replica signal (=frequency band of the monitor signal=60 MHz) remains as it is.

In this second embodiment, the signal component outside the frequency band of the replica signal (=frequency band of the monitor signal=60 MHz) is cut by the filters 45a, 45b. Therefore, the frequency band of the error signal provided to the estimation section 7 is restricted to the frequency band of the replica signal (the frequency band of the monitor signal), and the error signal provided to the estimation section 7 does not have the signal component outside the frequency band of the replica signal.

Therefore, even if the monitor band (60 MHz) is narrower than the frequency band (100 MHz) to be originally monitored, the filters 45a, 45b eliminate influence of the signal component outside the monitor band among the compensated signal components, on the estimation of the model by the estimation section, and thereby the distortion in the frequency band corresponding to the frequency band to be monitored can be stably suppressed.

Consequently, also in the distortion compensation apparatus 4 of the second embodiment, as in the distortion compensation apparatus 4 of the first embodiment, the operation of the distortion compensation apparatus 4 can be made stable even when the monitor band is narrowed.

It is noted that the components not particularly described in the second embodiment are identical to those of the first embodiment.

[3. Third Embodiment]

Hitherto, a limited radio resource is shared by a plurality of radio stations, with an operating frequency (hereinafter referred to as "channel") being assigned to each radio station.

If a certain radio station radiates power to a channel assigned to another radio station, which cannel is adjacent to a channel assigned to the certain radio station, crosstalk occurs between the radio stations.

Therefore, hitherto, regarding radio waves radiated from the radio stations, standards for ACLR (Adjacent Channel Leakage Ratio) (e.g., the standard defined by the ARIB (Association of Radio Industries and Businesses) have been provided. Therefore, when the amplifier circuit 1 is mounted to wireless communication equipment and used, it is essential to calculate an ACLR of the output signal y(t) of the amplifier 2, and evaluate whether or not the ACLR satisfies the above standard.

In calculating an ACLR, generally, a power value of a predetermined operating frequency band and power values of adjacent frequency components that are adjacent to the operating frequency band at both ends thereof in the frequency axis direction, which are obtained based on the output signal y(t) of the amplifier 2, are used. It is general to use a monitor signal y[n] obtained by monitoring the output signal y(t) of the amplifier 2. Then, from each of the frequency components of the monitor signal y[n], an ACLR (a ratio between an average power value of the frequency component of the operating frequency band and an average power value of the adjacent frequency components) is calculated.

By the way, when calculating an ACLR, if a necessary frequency component is not included in the monitor signal, an accurate ACLR cannot be calculated. When the input signal x[n] has a frequency band of 20 MHz, a monitor speed (monitor band) five times the frequency band, i.e., 100 MHz, is required.

However, in the amplifier circuit 1 according to the first and second embodiments, the filter 39 (39a, 39b) is provided before the ADC 40 (40a, 40b). Thereby, in the monitor signal $r_I[nd]$, $r_Q[nd]$ obtained from the ADC 40 (40a, 40b), parts of the adjacent frequency components (e.g., the frequency components outside the frequency band of 60 MHz) are cut. Therefore, if the ACLR is calculated using the monitor signal $r_I[nd]$, $r_Q[nd]$ as it is, since the cut adjacent frequency components are not reflected in the calculation, an accurate ACLR may not be obtained.

As described above, *[n] represents a digital signal which is, when the sampling interval is T (sec), sampled at time n×T. In addition, *[nd] (nd: a positive integer) represents a digital signal which is, when the sampling interval is Td (>T) [sec], sampled at time nd×Td.

In addition, $r_I[nd]$ and $r_Q[nd]$ represent monitor signals output from the ADCs 40a and 40b, respectively. Here, $r_I[nd]$ represents a real part (I-channel) of the monitor signal, and $r_Q[nd]$ represents an imaginary part (Q-channel) of the monitor signal. That is, the monitor signal is represented in a form of $r_I[nd]+i\times r_Q[nd]$ (i: an imaginary number).

On the other hand, in an amplifier circuit 201 according to the third embodiment, first, a distortion model described later is estimated based on the input signals $x_I[n]$, $x_Q[n]$ and the monitor signals $r_I[nd]$, $r_Q[nd]$. Then, based on the estimated distortion model, the cut parts of the adjacent frequency components are restored, and the restored adjacent frequency components are reflected in the calculation of the ACLR. Hereinafter, the amplifier circuit 201 according to the present embodiment will be described in detail.

Figure 5:
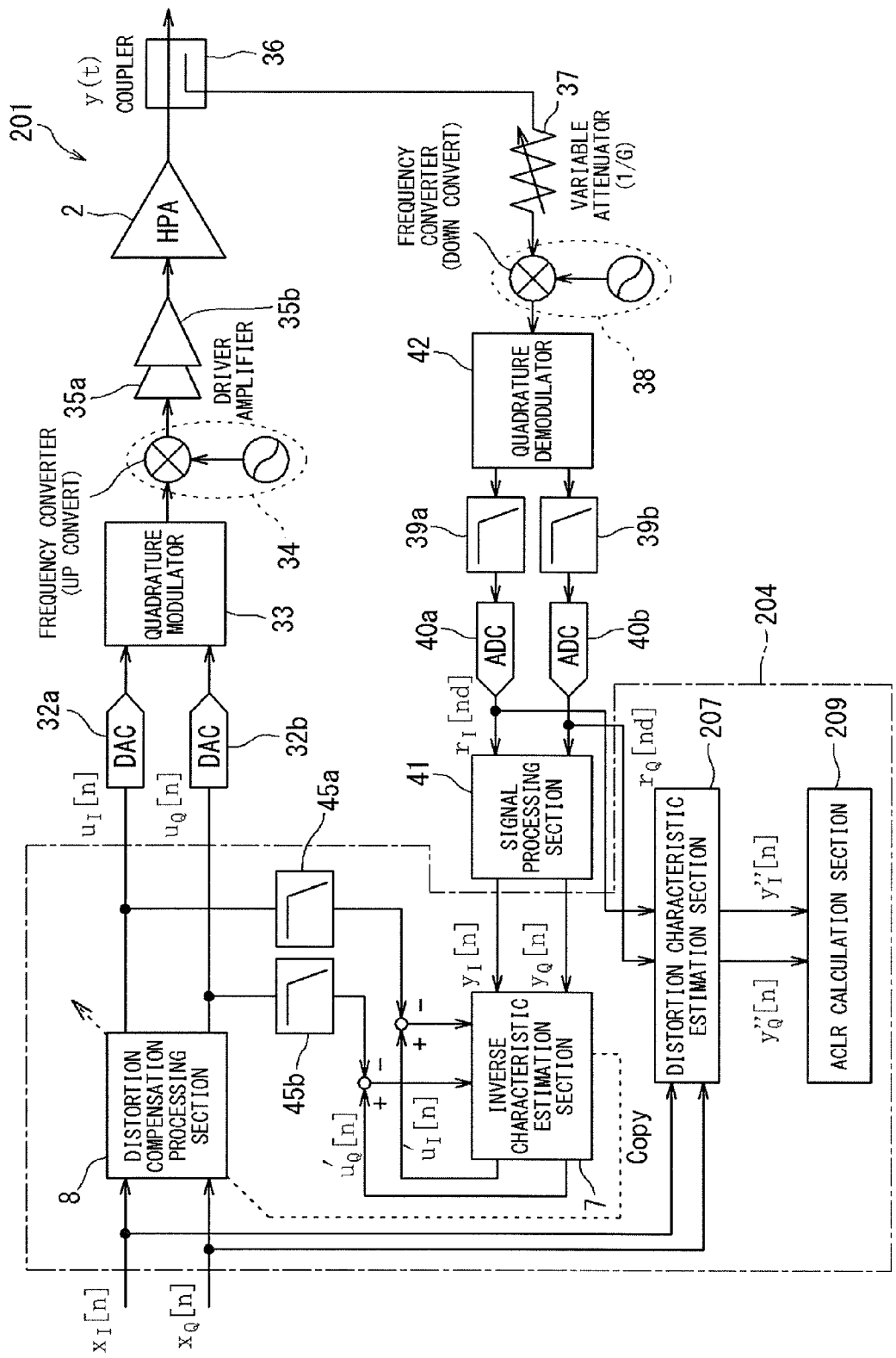
FIG. 5 is a circuit diagram of an amplifier circuit according to the third embodiment.

FIG. 5 shows the amplifier circuit 201 according to the present embodiment.

The amplifier circuit 201 is substantially identical to the amplifier circuit 1 according to the first and second embodiments, and is different from the amplifier circuit 1 according to the first and second embodiments in that a distortion compensation apparatus 204 includes a distortion characteristic estimation section 207, and an ACLR calculation section 209. The same components as those of the amplifier circuit 1 of the first and second embodiments are given the same reference numerals, and descriptions thereof are omitted as appropriate.

The distortion characteristic estimation section 207 estimates a sequence model (hereinafter referred to as "distortion model") corresponding to an amplification sequence composed of a distortion compensation processing section 8, a DAC 32 (32a, 32b), a quadrature modulator 33, a frequency converter 34, and an amplifier 2. The distortion characteristic estimation section 207 estimates the above-mentioned sequence model, based on the input signals $x_I[n]$, $x_Q[n]$ to the distortion compensation processing section 8, and the monitor signals $r_I[nd]$, $r_Q[nd]$.

Then, based on the estimated sequence model, the distortion characteristic estimation section 207 performs a distortion adding process for the input signals $x_I[n]$, $x_Q[n]$, and outputs distortion-added signals $y_I''[n]$, $y_Q''[n]$.

The ACLR calculation section 209 calculates the ACLR, based on the distortion-added signals $y_I''[n]$, $y_Q''[n]$ output from the distortion characteristic estimation section 207. Specifically, first, the ACLR calculation section 209 extracts, from the distortion-added signals $y_I''[n]$, $y_Q''[n]$, the frequency component of the operating frequency band of the input signals $x_I[n]$, $x_Q[n]$, and the adjacent frequency components other than the frequency component. The operating frequency band has been set in advance, for example. Then, the ACLR calculation section 209 calculates an ACLR (a ratio between an average power value of the frequency component in the operating frequency band and an average power value of the adjacent frequency components) based on the extracted frequency components.

Next, the configuration and operation of the distortion characteristic estimation section 207 will be described in detail.

Figure 6:
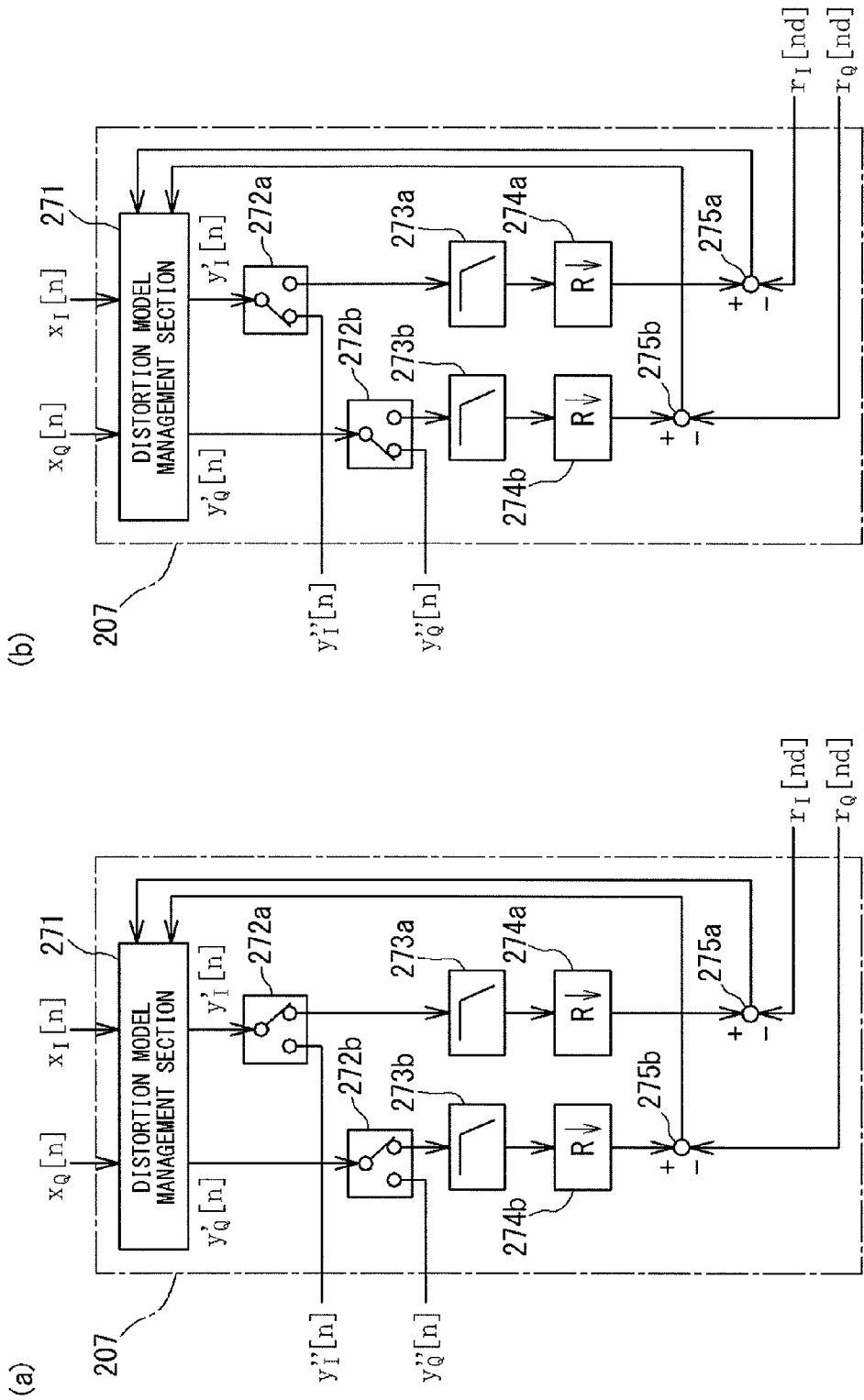
FIG. 6 shows a distortion characteristic estimation section according to the third embodiment, wherein (a) shows a configuration before a distortion model is established, and (b) shows a configuration after the distortion model is established.

FIG. 6 shows the configuration of the distortion characteristic estimation section 207, wherein (a) shows the state before a distortion model is established, and (b) shows the state after a distortion model is established.

The distortion characteristic estimation section 207 includes a distortion model management section 271, two selectors 272a, 272b, filters 273a, 273b, two decimation filters 274a, 274b, and differential units 275a, 275b.

The distortion model management section 271 manages the distortion model. The "manage" means retention of the distortion model, updating of the distortion model, and the like. The distortion model management section 271 calculates replica signals $y_I'[n]$, $y_Q'[n]$ based on the distortion model and the input signals $x_I[n]$, $x_Q[n]$, and outputs the replica signals. The distortion model is represented by a relational expression established between the input signals $x_I[n]$, $x_Q[n]$ and the replica signals $y_I'[n]$, $y_Q'[n]$. The relational expression is expressed by the following equation (1) if a memory effect that occurs inside the amplification sequence is not considered.

[Equation 1]

$$y'[n] = \sum_{k=1}^{K} g_k \cdot |x[n]|^{k-1} \cdot x[n] \quad (1)$$

In the equation 1, y'[n] indicates the replica signal, x[n] indicates the input signal, and $g_k$ (k=0, 1, 2, ..., K) indicates a coefficient parameter. In addition, K indicates a maximum order of the nonlinear characteristic of the distortion model. For example, when nonlinear terms up to the fifth-order nonlinear term are considered as the distortion model, K is set to 5.

The selectors 272a, 272b set a transmission path for the replica signals $y_I'[n]$, $y_Q'[n]$ output from the distortion model management section 271. Specifically, the selectors 272a, 272b set the transmission path to a path extending from the distortion model management section 271 to the filters 273a, 273b, or a path extending from the distortion model management section 271 to the outside of the distortion characteristic estimation section 207.

The filters 273a, 273b have the same frequency characteristics as the filters 39a, 39b. That is, the filters 273a, 273b are low-pass filters or bandpass filters.

The decimation filters 274a, 274b subject the replica signals $y_I'[n]$, $y_Q'[n]$ to a decimation process of decimating data other than data corresponding to the monitor signals $r_I[nd]$, $r_Q[nd]$ from the ADCs 40a and 40b.

The differential units 275a, 275b calculate and output error signals $(y_I'[n]-y_I[n])$, $(y_Q'[n]-y_Q[n])$, respectively. The error signals $(y_I'[n]-y_I[n])$, $(y_Q'[n]-y_Q[n])$ are signals corresponding to errors between the replica signals $y_I'[n]$, $y_Q'[n]$ subjected to the decimation process and the monitor signals $r_I[nd]$, $r_Q[nd]$, respectively.

Next, the operation of the distortion characteristic estimation section 207 will be described on assumption that the distortion model is represented by the relational expression expressed by the above equation (1).

First, the distortion model management section 271 calculates the replica signals $y_I'[n]$, $y_Q'[n]$ from the input signals $x_I[n]$, $x_Q[n]$, based on the equation (1) in which the coefficient parameter $g_k$ (k=0, 1, 2, ..., K) is set to an initial value, and outputs the replica signals. The selectors 272a, 272b set the transmission path for the replica signals $y_I'[n]$, $y_Q'[n]$ to the path extending from the distortion model management section 271 to the filters 273a, 273b.

Next, the replica signals $y_I'[n]$, $y_Q'[n]$ are subjected to filtering by the filters 273a, 273b and the decimation process by the decimation filters 274a, 274b.

Subsequently, the differential units 275a, 275b calculate error signals $(y_I'[n]-y_I[n])$, $(y_Q'[n]-y_Q[n])$ based on the replica signals $y_I'[n]$, $y_Q'[n]$ and the monitor signals $r_I[nd]$, $r_Q[nd]$, and output the error signals.

Thereafter, if the error signals ($y_I'[n]-y_I[n]$), ($y_Q'[n]-y_Q[n]$) supplied from the differential units 275a, 275b are larger than a predetermined reference value, the distortion model management section 271 updates the coefficient parameter $g_k$ (k=0, 1, 2, ..., K). Then, the distortion model management section 271 again calculates the replica signals $y_I'[n]$, $y_Q'[n]$ from the input signals $x_I[n]$, $x_Q[n]$ based on the equation (1), and outputs the replica signals.

Then, the distortion model management section 271 repeats updating of the coefficient parameter and outputting of the replica signals $y_I'[n]$, $y_Q'[n]$ until the error signals ($y_I'[n]-y_I[n]$), ($y_Q'[n]-y_Q[n]$) converge to the predetermined reference value or below. When the error signals ($y_I'[n]-y_I[n]$), ($y_Q'[n]-y_Q[n]$) have converged to the predetermined reference value or below, the distortion model management section 271 determines that the distortion model is established, and stops updating of the coefficient parameter $g_k$ (k=0, 1, 2, ..., K). The distortion model management section 271 may determine that the distortion model is established when, for example, the sum of the values of the error signals ($y_I'[n]-y_I[n]$), ($y_Q'[n]-y_Q[n]$), which is calculated per unit number of data, converges to a value smaller than a predetermined reference value.

After the distortion model has been established, the selectors 272a, 272b set the transmission path for the replica signals $y_I'[n]$, $y_Q'[n]$ to the path extending from the distortion model management section 271 to the outside of the distortion characteristic estimation section 207.

At this time (after the distortion model has been established), the replica signals $y_I'[n]$, $y_Q'[n]$ output to the outside of the distortion characteristic estimation section 207 correspond to the distortion-added signals $y_I''[n]$, $y_Q''[n]$. In addition, the process performed by the distortion model management section 271 to calculate the distortion-added signals $y_I''[n]$, $y_Q''[n]$ from the input signals $x_I[n]$, $x_Q[n]$ based on the equation (1) after the distortion model has been established corresponds to the distortion adding process.

As described above, the distortion characteristic estimation section 207 generates the replica signals $y_I'[n]$, $y_Q'[n]$ based on the input signals $x_I[n]$, $x_Q[n]$. Then, the distortion characteristic estimation section 207 estimates a distortion model based on the error signals ($y_I'[n]-y_I[n]$), ($y_I'[n]-y_Q[n]$) indicating the errors of the replica signals $y_I'[n]$, $y_Q'[n]$ with respect to the monitor signals $r_I[nd]$, $r_Q[nd]$.

Eventually, in the amplifier circuit 201 according to the present embodiment, the ACLR of the output signal y(t) of the amplifier 2 is calculated based on the distortion-added signals $y_I''[n]$, $y_Q''[n]$ in which the adjacent frequency components in the wider frequency band are reflected as compared to the monitor signals $r_I[nd]$, $r_Q[nd]$. Therefore, it is possible to calculate the ACLR with higher accuracy as compared to the configuration in which the ACLR of the output signal of the amplifier 2 is calculated based on the monitor signals $r_I[nd]$, $r_Q[nd]$.

[4. Forth Embodiment]

An amplifier circuit 301 according to the fourth embodiment has a function to calculate an ACLR, like the amplifier circuit 201 according to the third embodiment. The amplifier circuit 301 according to the present embodiment estimates a model of the amplifier 2 (amplifier model) based on the compensated signals $u_I[n]$, $u_Q[n]$ and the monitor signals $r_I[nd]$, $r_Q[nd]$. This amplifier circuit 301 is different from the amplifier circuit 201 of the third embodiment in that model estimation is performed not based on the input signals $x_I[n]$, $x_Q[n]$ but based on the compensated signals $u_I[n]$, $u_Q[n]$. Then, using the estimated amplifier model, the amplifier circuit 301 restores cut parts of the adjacent frequency components, and reflects the restored adjacent frequency components in the calculation of the ACLR. Hereinafter, the amplifier circuit 301 according to the present embodiment will be described in detail.

Figure 7:
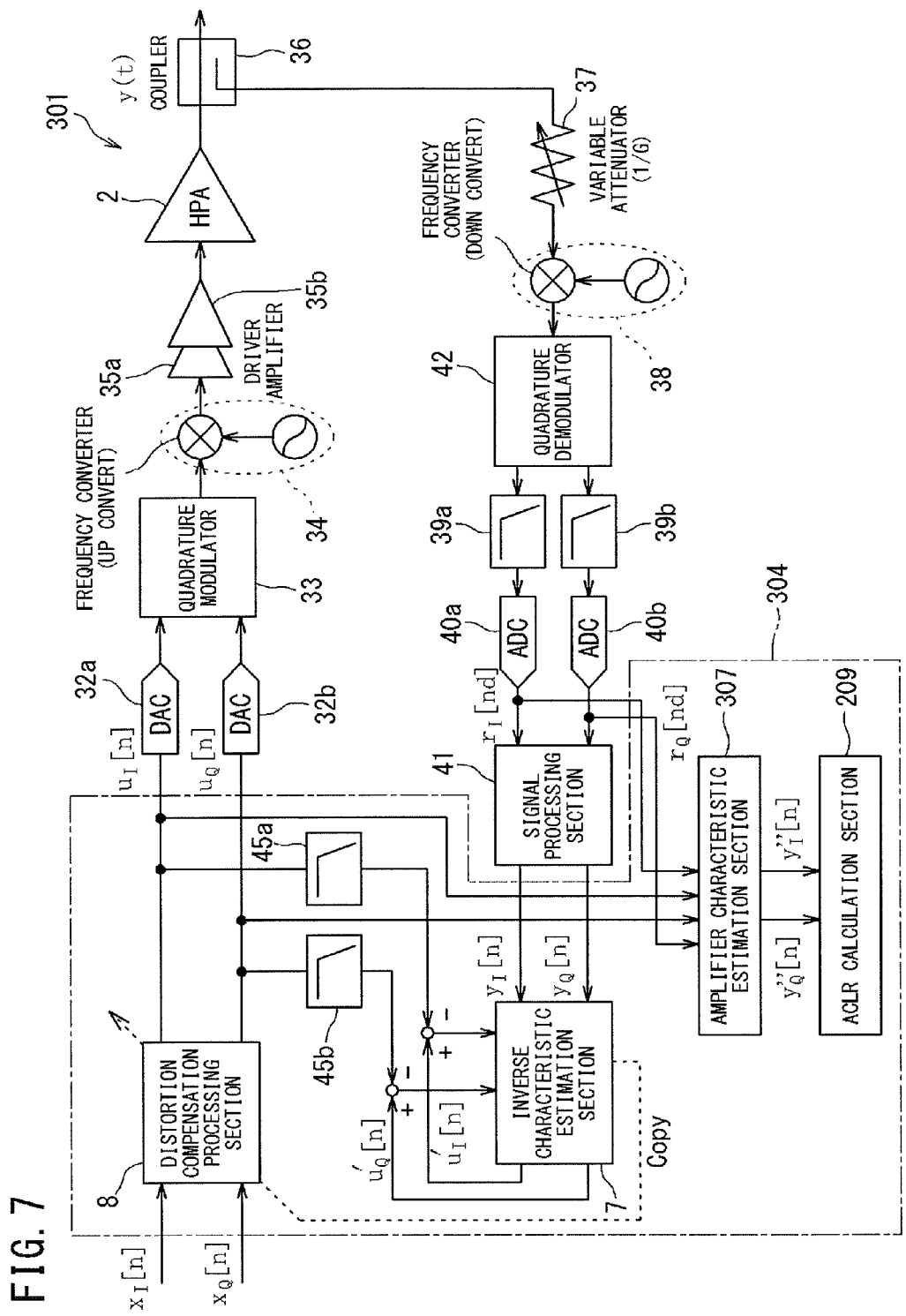
FIG. 7 is a circuit diagram of an amplifier circuit according to the fourth embodiment.

FIG. 7 shows the amplifier circuit 301 according to the present embodiment.

The amplifier circuit 301 is substantially identical to the amplifier circuit 201 according to the third embodiment, and is different from the amplifier circuit 201 of the third embodiment in that a distortion compensation apparatus 304 is provided with an amplifier characteristic estimation section 307 instead of the distortion characteristic estimation section 207. The same components as those of the amplifier circuit 201 of the third embodiment are given the same reference numerals, and descriptions thereof are omitted as appropriate.

The amplifier characteristic estimation section 307 estimates an amplifier model (forward model) of the amplifier 2. The amplifier characteristic estimation section 307 estimates the forward model, based on the compensated signals $u_I[n]$, $u_Q[n]$ output from the distortion compensation processing section 8, and the monitor signals $r_I[nd]$, $r_Q[nd]$. The forward model according to the present embodiment corresponds to a model of an amplifier which is not a so-called ET (Envelope Tracking) type, that is, a non-ET amplifier.

Then, based on the estimated forward model, the amplifier characteristic estimation section 307 subjects the compensated signals $u_I[n]$, $u_Q[n]$ to a distortion adding process, and outputs distortion-added signals $y_I''[n]$, $y_Q''[n]$.

Next, the configuration and operation of the amplifier characteristic estimation section 307 will be described in detail.

Figure 8:
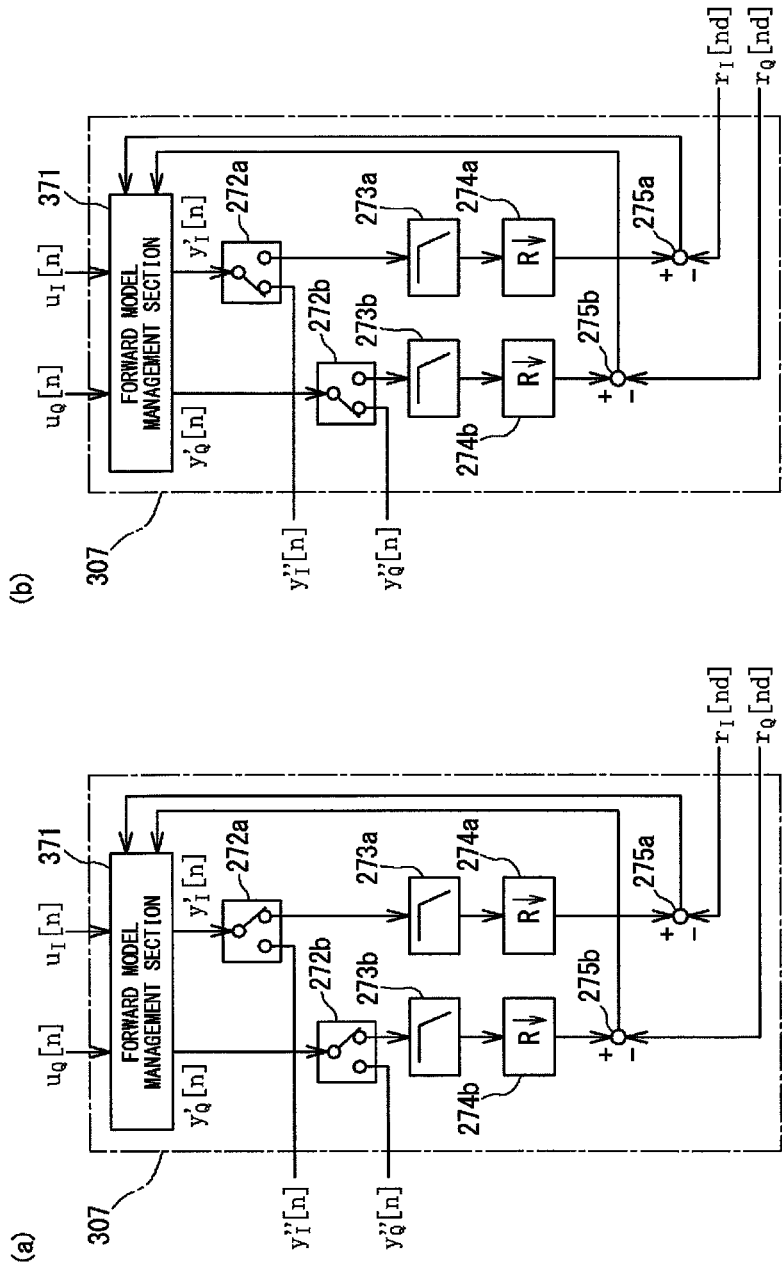
FIG. 8 shows an amplifier characteristic estimation section according to the fourth embodiment, wherein (a) shows a configuration before a forward model is established, and (b) shows a configuration after the forward model is established.

FIG. 8 shows the configuration of the amplifier characteristic estimation section 307, wherein (a) shows the state before the forward model is established, and (b) shows the state after the forward model is established.

The amplifier characteristic estimation section 307 includes a forward model management section 371, two selectors 272a, 272b, filters 273a, 273b, two decimation filters 274a, 274b, and differential units 275a, 275b. The same components as those of the distortion characteristic estimation section 207 of the third embodiment are given the same reference numerals, and descriptions thereof are omitted as appropriate.

The forward model management section 371 manages the forward model. The "manage" means retention of the forward model, updating of the forward model, and the like. The forward model management section 371 calculates replica signals $y_I'[n]$, $y_Q'[n]$ based on the forward model and the compensated signals $u_I[n]$, $u_Q[n]$, and outputs the replica signals. The forward model is represented by a relational expression established between the compensated signals $u_I[n]$, $u_Q[n]$ and the replica signals $y_I'[n]$, $y_Q'[n]$. The relational expression is expressed by the following equation (2) if a memory effect that occurs inside the amplification sequence is not considered.

[Equation 2]

$$y'[n] = \sum_{k=1}^{K} h_k \cdot |u[n]|^{k-1} \cdot u[n] \quad (2)$$

In the equation 2, y'[n] indicates the replica signal, u[n] indicates the compensated signal, and $h_k$ (k=0, 1, 2, ..., K) indicates a coefficient parameter. In addition, K indicates a maximum order of the nonlinear characteristic of the forward model. For example, if nonlinear terms up to the fifth-order nonlinear term are considered as the forward model, K is set to 5.

Next, the operation of the amplifier characteristic estimation section 307 will be described on assumption that the forward model is represented by the relational expression expressed by the above equation (2).

First, the forward model management section 371 calculates the replica signals $y_I'[n]$, $y_Q'[n]$ from the compensated signals $u_I[n]$, $u_Q[n]$, based on the equation (2) in which the coefficient parameter $h_k$ (k=0, 1, 2, . . . , K) is set to an initial value, and outputs the replica signals. The selectors 272a, 272b set the transmission path for the replica signals $y_I'[n]$, $y_Q'[n]$ to a path extending from the forward model management section 371 to the filters 273a, 273b.

Next, the replica signals $y_I'[n]$, $y_Q'[n]$ are subjected to filtering by the filters 273a, 273b and a decimation process by the decimation filters 274a, 274b.

Subsequently, the differential units 275a, 275b calculate error signals ($y_I'[n]-y_I[n]$), ($y_Q'[n]-y_Q[n]$) based on the replica signals $y_I'[n]$, $y_Q'[n]$ and the monitor signals $r_I[nd]$, $r_Q[nd]$, and output the error signals.

Thereafter, if the error signals ($y_I'[n]-y_I[n]$), ($y_Q'[n]-y_Q[n]$) supplied from the differential units 275a, 275b are larger than a predetermined reference value, the forward model management section 371 updates the coefficient parameter $h_k$ (k=0, 1, 2, . . . , K). Then, the forward model management section 371 again calculates the replica signals $y_I'[n]$, $y_Q'[n]$ from the compensated signals $u_I[n]$, $u_Q[n]$ based on the equation (2), and outputs the replica signals.

Then, the forward model management section 371 repeats updating of the coefficient parameter and outputting of the replica signals $y_I'[n]$, $y_Q'[n]$ until the error signals ($y_I'[n]-y_Q[n]$), ($y_Q'[n]-y_Q[n]$) converge to the predetermined reference value or below. When the error signals ($y_I'[n]-y_I[n]$), ($y_Q'[n]-y_Q[n]$) have converged to the predetermined reference signal value or below, the forward model management section 371 determines that the forward model is established, and stops updating of the coefficient parameter $h_k$ (k=0, 1, 2, . . . , K). The forward model management section 371 may determine that the forward model is established when, for example, the sum of the values of the error signals ($y_I'[n]-y_I[n]$), ($y_Q'[n]-y_Q[n]$) which is calculated per unit number of data converges to a value smaller than a predetermined reference value.

After the forward model has been established, the selectors 272a, 272b set the transmission path for the replica signals $y_I'[n]$, $y_Q'[n]$ to a path extending from the forward model management section 371 to the outside of the amplifier characteristic estimation section 307.

At this time (after the forward model has been established), the replica signals $y_I'[n]$, $y_Q'[n]$ output to the outside of the amplifier characteristic estimation section 307 correspond to the distortion-added signals $y_I''[n]$, $y_Q''[n]$. In addition, the process performed by the forward model management section 371 to calculate the distortion-added signals $y_I''[n]$, $y_Q''[n]$ from the compensated signals $u_I[n]$, $u_Q[n]$ based on the equation (2) after the forward model has been established corresponds to the distortion adding process.

As described above, the amplifier characteristic estimation section 307 generates the replica signals $y_I'[n]$, $y_Q'[n]$ based on the compensated signals $u_I[n]$, $u_Q[n]$. Then, the amplifier characteristic estimation section 307 estimates the forward model based on the error signals ($y_I'[n]-y_I[n]$), ($y_Q'[n]-y_Q[n]$) indicating the errors of the replica signals $y_I'[n]$, $y_Q'[n]$ with respect to the monitor signals $r_I[nd]$, $r_Q[nd]$.

Eventually, in the amplifier circuit 301 according to the present embodiment, the ACLR of the output signal y(t) of the amplifier 2 is calculated based on the distortion-added signals $y_I''[n]$, $y_Q''[n]$ in which the adjacent frequency components in the wider frequency band are reflected as compared to the monitor signals $r_I[nd]$, $r_Q[nd]$. Therefore, it is possible to calculate the ACLR with higher accuracy as compared to the configuration in which the ACLR of the output signal of the amplifier 2 is calculated based on the monitor signals $r_I[nd]$, $r_Q[nd]$.

The forward model is not limited to a model corresponding to a non-ET amplifier, and may be a model corresponding to an ET amplifier. In this case, the amplifier characteristic estimation section 307 estimates the forward model, based on the input signals $x_I[n]$, $x_Q[n]$ in addition to the compensated signals $u_I[n]$, $u_Q[n]$ and the monitor signals $r_I[nd]$, $r_Q[nd]$. Specifically, the forward model managed by the forward model management section 371 is expressed by the following relational equation (3):

[Equation 3]

$$y'[n] = \sum_{k=1}^{K} h_k \cdot |x[n]|^{k-1} \cdot u[n] \quad (3)$$

In the equation 3, y'[n] indicates the replica signal, x[n] indicates the input signal, u[n] indicates the compensated signal, and $h_k$ (k=0, 1, 2, . . . , K) indicates a coefficient parameter. In addition, K indicates a maximum order of the nonlinear characteristic of the forward model. For example, if nonlinear terms up to the fifth-order nonlinear term are considered as the forward model, K is set to 5.

[5. Appended Notes]

The embodiments described above are to be considered in all respects as illustrative and not restrictive. The scope of the present invention is indicated by the appended claims rather than by the foregoing meaning, and all changes which come within the meaning and range of equivalency of the claims are therefore intended to be embraced therein.

Further, the distortion compensation apparatus 4 is not limited to one that estimates an inverse model of an amplifier and performs distortion compensation based on the estimated inverse model. The distortion compensation apparatus 4 may estimate a forward model of an amplifier (the amplification characteristic itself of the amplifier), obtain inverse characteristic of the amplifier from the estimated forward model, and perform distortion compensation based on the inverse characteristic.

REFERENCE SIGNS LIST 1, 201, 301 amplifier circuit
2 amplifier
4 distortion compensation apparatus
7 estimation section
8 distortion compensation processing section
32a, 32b DAC (DA converter)
39a, 39b low-pass filter
40a, 40b ADC (AD converter)
45a, 45b low-pass filter (filter)
207 distortion characteristic estimation section (sequence characteristic estimation section)

209 ACLR calculation section
307 amplifier characteristic estimation section

The invention claimed is:

1. A distortion compensation apparatus that compensates for distortion of an amplifier, comprising:
a distortion compensation processing section configured to perform a predistortion process for a signal provided to the amplifier, based on an amplifier model of the amplifier, the distortion compensation processing section outputting a compensated signal to provide the compensated signal to the amplifier;
an estimation section configured to estimate the amplifier model; and
a filter, wherein
the estimation section estimates the amplifier model, based on the compensated signal before being provided to the amplifier and a monitor signal obtained by monitoring an output of the amplifier,
a monitor band of the monitor signal provided to the estimation section is narrower than a frequency band of the compensated signal,
the filter is provided so as to eliminate an influence of a signal component outside the monitor band among signal components of the compensated signal before being provided to the amplifier, on the estimation of the amplifier model by the estimation section,
the estimation section generates a replica signal of the compensated signal, based on the monitor signal obtained by monitoring the output of the amplifier, and estimates the amplifier model, based on an error signal indicating an error of the replica signal with respect to the compensated signal, and
the filter is provided so as to restrict a frequency band of the error signal to the frequency band of the monitor signal.

2. The distortion compensation apparatus according to claim 1, further comprising:
a sequence characteristic estimation section configured to estimate, based on an input signal to the distortion compensation processing section and the monitor signal, a sequence model of an amplification sequence including the amplifier and the distortion compensation processing section, and perform, based on the estimated sequence model, a distortion adding process for the input signal to output a distortion-added signal; and
a calculation section configured to calculate an Adjacent Channel Leakage Ratio based on the distortion-added signal output from the sequence characteristic estimation section.

3. The distortion compensation apparatus according to claim 2, wherein the sequence characteristic estimation section generates, based on the input signal, a replica signal of an output signal from the amplification sequence, and estimates the sequence model based on an error signal indicating an error of the replica signal with respect to the monitor signal.

4. The distortion compensation apparatus according to claim 1, further comprising:
an amplifier characteristic estimation section configured to estimate the amplifier model based on the compensated signal and the monitor signal, and perform a distortion adding process for the input signal based on the amplifier model to output a distortion-added signal; and
a calculation section configured to calculate an Adjacent Channel Leakage Ratio based on the distortion-added signal output from the amplifier characteristic estimation section.

5. The distortion compensation apparatus according to claim 4, wherein the amplifier characteristic estimation section generates, based on the compensated signal, a replica signal of an output signal from the amplifier, and estimates the amplifier model based on an error signal indicating an error of the replica signal with respect to the monitor signal.

6. The distortion compensation apparatus according to claim 1, wherein the amplifier has a power efficiency of 30% or more.

7. The distortion compensation apparatus according to claim 1, wherein a frequency band of the signal before subjected to the predistortion process by the distortion compensation processing section is 20 MHz or higher.

8. Wireless communication equipment including the distortion compensation apparatus according to claim 1.

* * * * *